(12) United States Patent
Khlat

(10) Patent No.: US 12,284,003 B2
(45) Date of Patent: Apr. 22, 2025

(54) PHASE AND AMPLITUDE ERROR CORRECTION IN A TRANSMISSION CIRCUIT

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 17/939,350

(22) Filed: Sep. 7, 2022

(65) Prior Publication Data

US 2023/0080621 A1 Mar. 16, 2023

Related U.S. Application Data

(60) Provisional application No. 63/245,151, filed on Sep. 16, 2021, provisional application No. 63/245,147, filed on Sep. 16, 2021.

(51) Int. Cl.
| | | |
|---|---|---|
| *H04B 7/005* | (2006.01) | |
| *H04B 1/40* | (2015.01) | |
| *H04L 25/03* | (2006.01) | |

(52) U.S. Cl.
CPC .............. *H04B 7/005* (2013.01); *H04B 1/40* (2013.01); *H04L 25/03261* (2013.01)

(58) Field of Classification Search
CPC ............ H04B 7/005; H04B 2001/0425; H04L 25/03261; H03F 1/3288; H03F 2200/451; H03F 2201/3233
See application file for complete search history.

(56) References Cited

U.S. PATENT DOCUMENTS

| | | |
|---|---|---|
| 4,797,898 A | 1/1989 | Martinez |
| 5,793,821 A | 8/1998 | Norrell et al. |

(Continued)

FOREIGN PATENT DOCUMENTS

| | | |
|---|---|---|
| CN | 105812073 A | 7/2016 |
| CN | 107483021 A | 12/2017 |

(Continued)

OTHER PUBLICATIONS

Paul Williams, "Crossover Filter Shape Comparisons", A White Paper from Linea Research, Jul. 2013 (Year: 2013).*

(Continued)

*Primary Examiner* — Aristocratis Fotakis
(74) *Attorney, Agent, or Firm* — Withrow & Terranova, P.L.L.C.

(57) ABSTRACT

Phase and amplitude error correction in a transmission circuit is provided. The transmission circuit includes a transceiver circuit, a power management integrated circuit (PMIC), and a power amplifier circuit(s). The transceiver circuit generates a radio frequency (RF) signal(s) from an input vector, the PMIC generates a modulated voltage, and the power amplifier circuit(s) amplifies the RF signal(s) based on the modulated voltage. In embodiments disclosed herein, the transceiver circuit is configured to equalize the input vector using multiple complex filters to thereby correct amplitude-amplitude (AM-AM) and amplitude-phase (AM-PM) errors. As a result, it is possible to reduce undesired instantaneous excessive compression and/or spectrum regrowth to thereby improve efficiency and linearity of the power amplifier circuit(s) across the modulation bandwidth.

18 Claims, 11 Drawing Sheets

(56) References Cited

U.S. PATENT DOCUMENTS

| | | |
|---|---|---|
| 6,630,862 B1 | 10/2003 | Perthold et al. |
| 6,760,451 B1 | 7/2004 | Craven et al. |
| 6,947,711 B1 | 9/2005 | Leyonhjelm |
| 7,076,225 B2 | 7/2006 | Li et al. |
| 7,170,342 B2 | 1/2007 | Suzuki et al. |
| 7,430,248 B2 | 9/2008 | McCallister |
| 7,663,436 B2 | 2/2010 | Takano et al. |
| 7,683,713 B2 | 3/2010 | Hongo |
| 7,755,429 B2 | 7/2010 | Nguyen et al. |
| 7,859,338 B2 | 12/2010 | Bajdechi et al. |
| 7,889,820 B2 | 2/2011 | Murthy et al. |
| 8,605,819 B2 | 12/2013 | Lozhkin |
| 8,649,745 B2 | 2/2014 | Bai et al. |
| 8,749,309 B2 | 6/2014 | Ho et al. |
| 8,831,544 B2 | 9/2014 | Walker et al. |
| 8,884,692 B2 | 11/2014 | Lee |
| 9,036,734 B1 | 5/2015 | Mauer et al. |
| 9,065,504 B1 | 6/2015 | Kwon et al. |
| 9,112,413 B2 | 8/2015 | Barth et al. |
| 9,356,760 B2 | 5/2016 | Larsson et al. |
| 9,438,196 B2 | 9/2016 | Smith et al. |
| 9,560,595 B2 | 1/2017 | Dakshinamurthy et al. |
| 9,692,366 B2 | 6/2017 | Pilgram |
| 9,705,477 B2 | 7/2017 | Velazquez |
| 9,973,370 B1 | 5/2018 | Langer et al. |
| 10,177,719 B2 | 1/2019 | Gazneli et al. |
| 10,305,435 B1* | 5/2019 | Murugesu .............. H03F 3/189 |
| 10,326,408 B2 | 6/2019 | Khlat et al. |
| 10,361,744 B1 | 7/2019 | Khlat |
| 10,476,437 B2 | 11/2019 | Nag et al. |
| 10,778,345 B2 | 9/2020 | El-Hassan et al. |
| 11,005,368 B2 | 5/2021 | Bansal et al. |
| 11,088,660 B2 | 8/2021 | Lin et al. |
| 11,387,789 B2 | 7/2022 | Khlat et al. |
| 11,424,719 B2 | 8/2022 | Khlat |
| 11,569,783 B2 | 1/2023 | Nomiyama et al. |
| 11,637,531 B1 | 4/2023 | Perreault et al. |
| 2001/0054974 A1 | 12/2001 | Wright |
| 2002/0190811 A1* | 12/2002 | Sperber ................ H04B 3/143 |
| | | 333/28 R |
| 2003/0042979 A1 | 3/2003 | Gurvich et al. |
| 2004/0239446 A1 | 12/2004 | Gurvich et al. |
| 2005/0100105 A1 | 5/2005 | Jensen |
| 2005/0254659 A1 | 11/2005 | Heinsen |
| 2006/0068710 A1 | 3/2006 | Jensen |
| 2006/0209981 A1 | 9/2006 | Kluesing et al. |
| 2006/0217083 A1 | 9/2006 | Braithwaite |
| 2007/0032208 A1 | 2/2007 | Choi et al. |
| 2008/0009258 A1 | 1/2008 | Safarian et al. |
| 2008/0074209 A1 | 3/2008 | Ceylan et al. |
| 2008/0246550 A1* | 10/2008 | Biedka ................ H03C 5/00 |
| | | 332/149 |
| 2009/0004981 A1 | 1/2009 | Eliezer et al. |
| 2009/0061787 A1 | 3/2009 | Koller et al. |
| 2009/0074106 A1* | 3/2009 | See .................. H04L 27/362 |
| | | 375/300 |
| 2009/0125264 A1 | 5/2009 | Betts et al. |
| 2009/0141830 A1 | 6/2009 | Ye |
| 2009/0232260 A1 | 9/2009 | Hayashi et al. |
| 2009/0302945 A1 | 12/2009 | Catoiu et al. |
| 2010/0135439 A1 | 6/2010 | Lackey |
| 2010/0298030 A1 | 11/2010 | Howard |
| 2011/0095826 A1 | 4/2011 | Hadjichristos et al. |
| 2011/0182347 A1 | 7/2011 | Cheung |
| 2011/0227767 A1 | 9/2011 | O'Brien |
| 2012/0068748 A1 | 3/2012 | Stojanovic et al. |
| 2012/0139635 A1 | 6/2012 | Ho et al. |
| 2012/0189081 A1* | 7/2012 | Omoto ................ H04L 27/36 |
| | | 375/298 |
| 2012/0244824 A1 | 9/2012 | Entezari et al. |
| 2012/0256688 A1* | 10/2012 | Onishi ................ H03F 1/0244 |
| | | 330/149 |
| 2013/0141062 A1 | 6/2013 | Khlat |
| 2013/0214858 A1 | 8/2013 | Tournatory et al. |
| 2013/0222057 A1 | 8/2013 | Henshaw |
| 2013/0243129 A1 | 9/2013 | Okuni et al. |
| 2014/0028368 A1 | 1/2014 | Khlat |
| 2014/0029683 A1* | 1/2014 | Morris ................ H03F 3/24 |
| | | 375/267 |
| 2014/0062590 A1 | 3/2014 | Khlat et al. |
| 2014/0062599 A1 | 3/2014 | Xu et al. |
| 2014/0065989 A1 | 3/2014 | McLaurin |
| 2014/0072307 A1 | 3/2014 | Zamani et al. |
| 2014/0084996 A1 | 3/2014 | Schwent et al. |
| 2014/0105264 A1 | 4/2014 | McLaurin et al. |
| 2014/0184337 A1 | 7/2014 | Nobbe et al. |
| 2014/0213196 A1 | 7/2014 | Langer et al. |
| 2014/0232470 A1 | 8/2014 | Wilson |
| 2014/0266432 A1 | 9/2014 | Scott et al. |
| 2014/0315504 A1 | 10/2014 | Sakai et al. |
| 2014/0361837 A1 | 12/2014 | Strange et al. |
| 2015/0028946 A1 | 1/2015 | Al-Qaq et al. |
| 2015/0126142 A1 | 5/2015 | Meredith |
| 2015/0333781 A1 | 11/2015 | Alon et al. |
| 2016/0173030 A1 | 6/2016 | Langer et al. |
| 2016/0174293 A1 | 6/2016 | Mow et al. |
| 2016/0182099 A1 | 6/2016 | Boddupally et al. |
| 2016/0182100 A1 | 6/2016 | Menkhoff et al. |
| 2016/0301432 A1 | 10/2016 | Shizawa et al. |
| 2016/0322992 A1 | 11/2016 | Okawa et al. |
| 2017/0005676 A1 | 1/2017 | Yan et al. |
| 2017/0104502 A1* | 4/2017 | Pratt ................ H04L 27/368 |
| 2017/0149457 A1 | 5/2017 | Mayer et al. |
| 2017/0170838 A1 | 6/2017 | Pagnanelli |
| 2017/0338842 A1 | 11/2017 | Pratt |
| 2017/0353197 A1 | 12/2017 | Ruffieux et al. |
| 2018/0034418 A1 | 2/2018 | Blednov |
| 2018/0175813 A1 | 6/2018 | Scott et al. |
| 2018/0226923 A1 | 8/2018 | Nagamori |
| 2018/0248570 A1 | 8/2018 | Camuffo |
| 2019/0041890 A1 | 2/2019 | Chen et al. |
| 2019/0058530 A1 | 2/2019 | Rainish et al. |
| 2019/0068234 A1* | 2/2019 | Khlat ................ H04B 1/40 |
| 2019/0238152 A1 | 8/2019 | Pagnanelli |
| 2019/0245496 A1 | 8/2019 | Khlat et al. |
| 2019/0296929 A1 | 9/2019 | Milicevic et al. |
| 2019/0319583 A1 | 10/2019 | El-Hassan et al. |
| 2019/0356285 A1 | 11/2019 | Khlat et al. |
| 2020/0106392 A1 | 4/2020 | Khlat et al. |
| 2020/0119699 A1* | 4/2020 | Nishihara ................ H04B 1/04 |
| 2020/0136563 A1 | 4/2020 | Khlat |
| 2020/0136568 A1 | 4/2020 | Hosoda et al. |
| 2020/0162030 A1 | 5/2020 | Drogi et al. |
| 2020/0204422 A1 | 6/2020 | Khlat |
| 2020/0259685 A1* | 8/2020 | Khlat ................ H04L 25/03828 |
| 2020/0295713 A1 | 9/2020 | Khlat |
| 2020/0336111 A1 | 10/2020 | Khlat |
| 2021/0067097 A1 | 3/2021 | Wang et al. |
| 2021/0099136 A1 | 4/2021 | Drogi et al. |
| 2021/0143859 A1 | 5/2021 | Hageraats et al. |
| 2021/0194517 A1 | 6/2021 | Mirea et al. |
| 2021/0281228 A1 | 9/2021 | Khlat |
| 2021/0399690 A1 | 12/2021 | Panseri et al. |
| 2022/0021348 A1 | 1/2022 | Philpott et al. |
| 2022/0216834 A1 | 7/2022 | Myoung et al. |
| 2022/0360229 A1 | 11/2022 | Khlat |
| 2022/0407462 A1 | 12/2022 | Khlat |
| 2022/0407463 A1 | 12/2022 | Khlat et al. |
| 2022/0407464 A1 | 12/2022 | Khlat et al. |
| 2022/0407465 A1 | 12/2022 | Khlat |
| 2022/0407478 A1 | 12/2022 | Khlat et al. |
| 2023/0065760 A1 | 3/2023 | Hellberg |
| 2023/0079153 A1 | 3/2023 | Khlat |
| 2023/0080652 A1 | 3/2023 | Khlat et al. |
| 2023/0081095 A1 | 3/2023 | Khlat |
| 2023/0082145 A1 | 3/2023 | Lin et al. |
| 2023/0155614 A1 | 5/2023 | Jelonnek et al. |

(56) References Cited

U.S. PATENT DOCUMENTS

| | | | |
|---|---|---|---|
| 2023/0238927 | A1 | 7/2023 | Kay et al. |
| 2023/0387859 | A1 | 11/2023 | Drogi et al. |

FOREIGN PATENT DOCUMENTS

| | | | |
|---|---|---|---|
| CN | 110798155 | A | 2/2020 |
| CN | 210693998 | U | 6/2020 |
| CN | 112995079 | A | 6/2021 |
| EP | 2705604 | A2 | 3/2014 |
| EP | 2582041 | B1 | 4/2018 |
| EP | 2232713 | B1 | 10/2018 |
| EP | 3416340 | A1 | 12/2018 |
| JP | 2011211533 | A | 10/2011 |
| JP | 2015099972 | A | 5/2015 |
| WO | 2007092794 | A2 | 8/2007 |
| WO | 2010011551 | A2 | 1/2010 |
| WO | 2010135711 | A1 | 11/2010 |
| WO | 2014026178 | A1 | 2/2014 |
| WO | 2021042088 | A2 | 3/2021 |
| WO | 2023150539 | A1 | 8/2023 |
| WO | 2023150545 | A1 | 8/2023 |
| WO | 2023150587 | A1 | 8/2023 |

OTHER PUBLICATIONS

International Search Report and Written Opinion for International Patent Application No. PCT/US2022/043600, mailed Jan. 11, 2023, 15 pages.

Non-Final Office Action for U.S. Appl. No. 17/942,472, mailed Feb. 16, 2023, 13 pages.

Extended European Search Report for European Patent Application No. 22195382.1, mailed Feb. 1, 2023, 26 pages.

Extended European Search Report for European Patent Application No. 22195683.2, mailed Feb. 10, 2023, 12 pages.

Non-Final Office Action for U.S. Appl. No. 17/700,700, mailed Apr. 13, 2023, 11 pages.

Bai, W.-D. et al., "Principle of Vector Synthesis Predistortion Linearizers Controlling AM/AM and AM/PM Independently," 2016 IEEE International Conference on Ubiquitous Wireless Broadband (ICUWB), Oct. 16-19, 2016, Nanjing, China, IEEE, 3 pages.

Extended European Search Report for European Patent Application No. 22195695.6, mailed Feb. 14, 2023, 12 pages.

Extended European Search Report for European Patent Application No. 22196188.1, mailed Feb. 2, 2023, 25 pages.

International Search Report and Written Opinion for International Patent Application No. PCT/US2023/060303, mailed Apr. 11, 2023, 12 pages.

Paek, J.-S. et al., "Design of Boosted Supply Modulator With Reverse Current Protection for Wide Battery Range in Envelope Tracking Operation," IEEE Transactions on Microwave Theory and Techniques, vol. 67, No. 1, Jan. 2019, pp. 183-194.

Non-Final Office Action for U.S. Appl. No. 17/700,685, mailed Dec. 22, 2023, 24 pages.

Non-Final Office Action for U.S. Appl. No. 17/689,232, mailed Dec. 11, 2023, 27 pages.

Notice of Allowance and Examiner-Initiated Interview Summary for U.S. Appl. No. 17/737,300, mailed Dec. 19, 2023, 12 pages.

Notice of Allowance for U.S. Appl. No. 17/700,700, mailed Oct. 23, 2023, 9 pages.

Supplemental Notice of Allowability for U.S. Appl. No. 17/700,700, mailed Nov. 8, 2023, 5 pages.

Extended European Search Report for European Patent Application No. 23174010.1, mailed Oct. 10, 2023, 10 pages.

Corrected Notice of Allowability for U.S. Appl. No. 17/737,300, mailed Dec. 27, 2023, 8 pages.

Final Office Action for U.S. Appl. No. 17/942,472, mailed Jul. 19, 2023, 16 pages.

Advisory Action for U.S. Appl. No. 17/942,472, mailed Sep. 15, 2023, 3 pages.

Notice of Allowance for U.S. Appl. No. 17/942,472, mailed Oct. 18, 2023, 10 pages.

International Search Report and Written Opinion for International Patent Application No. PCT/US2023/019267, mailed Aug. 3, 2023, 14 pages.

Cho, M., "Analog Predistortion for Improvement of RF Power Amplifier Efficiency and Linearity," A Dissertation presented to the Academic Faculty in partial fulfillment of the requirements for the degree Doctor of Philosophy in the School of Electrical and Computer Engineering, Georgia Institute of Technology, Aug. 2016, available from the Internet: [URL: https://repository.gatech.edu/server/api/core/bitstreams/b8fe5cbb-e5db-4efe-b9a2-eaad5f671f14/content], 113 pages.

Kwak, T.-W. et al., "A 2W CMOS Hybrid Switching Amplitude Modulator for EDGE Polar Transmitters," IEEE Journal of Solid-State Circuits, vol. 42, No. 12, Dec. 2007, IEEE, pp. 2666-2676.

Paek, J.-S. et al., "A -137 dBm/Hz Noise, 82% Efficiency AC-Coupled Hybrid Supply Modulator With Integrated Buck-Boost Converter," IEEE Journal of Solid-State Circuits, vol. 51, No. 11, Nov. 2016, IEEE pp. 2757-2768.

Non-Final Office Action for U.S. Appl. No. 17/737,300, mailed Aug. 28, 2023, 14 pages.

Extended European Search Report for European Patent Application No. 23153108.8, mailed Jun. 20, 2023, 18 pages.

Notice of Allowance for U.S. Appl. No. 17/700,685, mailed Apr. 5, 2024, 7 pages.

Final Office Action for U.S. Appl. No. 17/689,232, mailed Mar. 26, 2024, 28 pages.

Supplemental Notice of Allowability for U.S. Appl. No. 17/700,700, mailed Feb. 28, 2024, 5 pages.

Corrected Notice of Allowability for U.S. Appl. No. 17/942,472, mailed Nov. 17, 2023, 6 pages.

Advisory Action U.S. Appl. No. 17/689,232, mailed May 23, 2024, 3 pages.

Non-Final Office Action for U.S. Appl. No. 17/689,232, mailed Jul. 17, 2024, 22 pages.

Non-Final Office Action for U.S. Appl. No. 17/700,826, mailed May 15, 2024, 28 pages.

International Search Report and Written Opinion for International Patent Application No. PCT/US2023/061734, mailed May 30, 2023, 15 pages.

International Search Report and Written Opinion for International Patent Application No. PCT/US2023/061741, mailed Jun. 1, 2023, 14 pages.

Invitation to Pay Additional Fees and Partial International Search for International Patent Application No. PCT/US2023/061804, mailed May 26, 2023, 10 pages.

International Search Report and Written Opinion for International Patent Application No. PCT/US2023/061804, mailed Jul. 17, 2023, 20 pages.

Hammi et al., "Temperature Compensated Digital Predistorter for 3G Power Amplifiers," Electronics, Circuit and Systems, 2005, Dec. 11, 2005, pp. 1-4.

Hao et al., "Hybrid Analog/Digital Linearization Based on Dual-Domain Decomposition of Nonlinearity," 2019 IEEE Asia-Pacific Microwave Conference, Dec. 10, 2019, pp. 156-158.

Lee et al., "Fully Automated Adaptive Analog Predistortion Power Amplifier in WCDMA Applications," 2005 European Microwave Conference CNIT La Defense, Paris, France, vol. 2, Oct. 4, 2005, pp. 967-970.

Li et al., "Analog Predistorter Averaged Digital Predistortion for Power Amplifiers in Hybrid Beam-Forming Multi-Input Multi-Output Transmitter," IEEE Access, vol. 8, Aug. 1, 2020, pp. 146145-146153.

Tome et al., "Hybrid Analog/Digital Linearizatio nof GaN HEMT-Based Power Amplifiers," IEEE Transactions on Microwave Theory and Techniques, vol. 67, No. 1, Jan. 1, 2019, pp. 288-294.

Notice of Allowance for U.S. Appl. No. 17/689,232, mailed Oct. 21, 2024, 10 pages.

Notice of Allowance for U.S. Appl. No. 17/714,244, mailed Sep. 16, 2024, 8 pages.

Non-Final Office Action for U.S. Appl. No. 17/890,538, mailed Oct. 21, 2024, 13 pages.

(56) References Cited

OTHER PUBLICATIONS

Notice of Allowance and Examiner-Initiated Interview Summary for U.S. Appl. No. 17/700,826, mailed Sep. 11, 2024, 10 pages.
International Search Report and Written Opinion for International Patent Application No. PCT/US2023/060803, mailed May 19, 2023, 13 pages.
International Search Report and Written Opinion for International Patent Application No. PCT/US2023/060804, mailed May 4, 2023, 19 pages.
International Search Report and Written Opinion for International Patent Application No. PCT/US2023/025512, mailed Sep. 28, 2023, 13 pages.

* cited by examiner

```
                    ┌─────────────────────────────────────┐
                    │ GENERATE AN INPUT VECTOR (b⃗_MOD)     │
                    │ MODULATED ACROSS A MODULATION        │
           200      │ BANDWIDTH INCLUDING A PLURALITY OF   │
             ↘      │ MODULATION FREQUENCIES (F_1-F_M),    │
                    │ THE INPUT VECTOR (b⃗_MOD) IS         │
                    │ ASSOCIATED WITH MULTIPLE TIME-VARIANT│
                    │ AMPLITUDES (AM_1(t)-AM_M(t)) AND     │
                    │ MULTIPLE TIME-VARIANT GROUP DELAYS   │
                    │ (τ_1-τ_M) EACH CORRESPONDING TO A    │
                    │ RESPECTIVE ONE OF THE MULTIPLE       │
                    │ MODULATION FREQUENCIES (F_1-F_M)     │
                    │                 202                  │
                    └─────────────────────────────────────┘
                                      │
                                      ▼
                    ┌─────────────────────────────────────┐
                    │ APPLY A FREQUENCY EQUALIZATION       │
                    │ FILTER (H_FEQ(s)) TO THE INPUT       │
                    │ VECTOR ((b⃗_MOD)) TO THEREBY          │
                    │ GENERATE A FREQUENCY-EQUALIZED       │
                    │ INPUT VECTOR ((b⃗_MOD-F)) ASSOCIATED  │
                    │ WITH AN EQUALIZED TIME-VARIANT       │
                    │ AMPLITUDE (AM_EQ(t)) THAT IS         │
                    │ IDENTICAL IN EACH OF THE MULTIPLE    │
                    │ MODULATION FREQUENCIES (F_1-F_M)     │
                    │ AND AN EQUALIZED TIME-VARIANT GROUP  │
                    │ DELAY (τ_EQ) THAT IS IDENTICAL IN    │
                    │ EACH OF THE MULTIPLE MODULATION      │
                    │ FREQUENCIES (F_1-F_M)                │
                    │                 204                  │
                    └─────────────────────────────────────┘
```

*FIG. 7*

PHASE AND AMPLITUDE ERROR CORRECTION IN A TRANSMISSION CIRCUIT

RELATED APPLICATIONS

This application claims the benefit of provisional patent application Ser. No. 63/245,147, filed Sep. 16, 2021, and provisional patent application Ser. No. 63/245,151, filed Sep. 16, 2021, the disclosures of which are hereby incorporated herein by reference in their entireties.

FIELD OF THE DISCLOSURE

The technology of the disclosure relates generally to correcting amplitude-amplitude (AM-AM) and amplitude-phase (AM-PM) errors in a transmission circuit.

BACKGROUND

Mobile communication devices have become increasingly common in current society for providing wireless communication services. The prevalence of these mobile communication devices is driven in part by the many functions that are now enabled on such devices. Increased processing capability in such devices means that mobile communication devices have evolved from being pure communication tools into sophisticated mobile multimedia centers that enable enhanced user experiences.

The redefined user experience relies on a higher data rate offered by advanced fifth generation (5G) and 5G new radio (5G-NR) technologies, which typically transmit and receive radio frequency (RF) signals in millimeter wave spectrums. Given that the RF signals are more susceptible to attenuation and interference in the millimeter wave spectrums, the RF signals are typically amplified by state-of-the-art power amplifiers to help boost the RF signals to higher power before transmission.

In a typical transmission circuit, a transceiver circuit is configured to generate an RF signal, a power management circuit is configured to generate a modulated voltage, a power amplifier circuit is configured to amplify the RF signal based on the modulated voltage, and an antenna circuit is configured to transmit the RF signal in one or more transmission frequencies. The power amplifier circuit can be further coupled to the antenna circuit via an RF front-end circuit (e.g., filter, switches, etc.). Notably, an output reflection coefficient (e.g., $S_{22}$) of the power amplifier circuit can interact with an input reflection coefficient (e.g., $S_{11}$) of the RF front-end circuit to cause a group delay in the RF signal to potentially create an amplitude-to-amplitude (AM-AM) error in the modulated voltage and/or an amplitude-to-phase (AM-PM) error in the RF signal. As such, it is desirable to correct the AM-AM and AM-PM errors in all of the transmission frequencies to help prevent undesired amplitude distortion and/or spectrum regrowth, particularly when the RF signal is modulated across a wide modulation bandwidth (e.g., ≥200 MHz).

SUMMARY

Embodiments of the disclosure relate to phase and amplitude error correction in a transmission circuit. The transmission circuit includes a transceiver circuit, a power management integrated circuit (PMIC), and a power amplifier circuit(s). The transceiver circuit generates a radio frequency (RF) signal(s) from an input vector, the PMIC generates a modulated voltage, and the power amplifier circuit(s) amplifies the RF signal(s) based on the modulated voltage. When the power amplifier circuit(s) is coupled to an RF front-end circuit (e.g., filter/multiplexer), an output reflection coefficient (e.g., $S_{22}$) of the power amplifier circuit(s) can interact with an input reflection coefficient (e.g., $S_{11}$) of the RF front-end circuit to create a voltage distortion filter on an output stage of the power amplifier circuit(s), which can cause unwanted amplitude-amplitude (AM-AM) and amplitude-phase (AM-PM) errors across a modulation bandwidth of the transmission circuit. In this regard, in embodiments disclosed herein, the transceiver circuit is configured to equalize the input vector using multiple complex filters to thereby correct the AM-AM and AM-PM errors. As a result, it is possible to reduce undesired instantaneous excessive compression and/or spectrum regrowth to thereby improve efficiency and linearity of the power amplifier circuit(s) across the modulation bandwidth.

In one aspect, a transceiver circuit is provided. The transceiver circuit includes a digital processing circuit. The digital processing circuit is configured to generate an input vector modulated across a modulation bandwidth comprising multiple modulation frequencies. The input vector is associated with multiple time-variant amplitudes and multiple time-variant group delays each corresponding to a respective one of the multiple modulation frequencies. The transceiver circuit also includes a frequency equalizer circuit. The frequency equalizer circuit is configured to apply a frequency equalization filter to the input vector to thereby generate a frequency-equalized input vector. The frequency-equalized input vector is associated with an equalized time-variant amplitude that is identical in each of the multiple modulation frequencies. The frequency-equalized input vector is also associated with an equalized time-variant group delay that is identical in each of the multiple modulation frequencies.

In another aspect, a method for correcting phase and amplitude errors in a transmission circuit is provided. The method includes generating an input vector modulated across a modulation bandwidth comprising multiple modulation frequencies. The input vector is associated with multiple time-variant amplitudes and multiple time-variant group delays each corresponding to a respective one of the multiple modulation frequencies. The method also includes applying a frequency equalization filter to the input vector to thereby generate a frequency-equalized input vector. The frequency-equalized input vector is associated with an equalized time-variant amplitude that is identical in each of the multiple modulation frequencies. The frequency-equalized input vector is also associated with an equalized time-variant group delay that is identical in each of the multiple modulation frequencies.

In another aspect, a transmission circuit is provided. The transmission circuit includes a transceiver circuit. The transceiver circuit includes a digital processing circuit. The digital processing circuit is configured to generate an input vector modulated across a modulation bandwidth comprising multiple modulation frequencies. The input vector is associated with multiple time-variant amplitudes and multiple time-variant group delays each corresponding to a respective one of the multiple modulation frequencies. The transceiver circuit also includes a frequency equalizer circuit. The frequency equalizer circuit is configured to apply a frequency equalization filter to the input vector to thereby generate a frequency-equalized input vector. The frequency-equalized input vector is associated with an equalized time-variant amplitude that is identical in each of the multiple modulation frequencies. The frequency-equalized input vector is also associated with an equalized time-variant group delay that is identical in each of the multiple modulation frequencies.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 7 is a flowchart of an exemplary process that can be employed by the transmission circuit of FIG. 2 to correct the unwanted AM-AM and AM-PM errors.

DETAILED DESCRIPTION

Figure 1A:
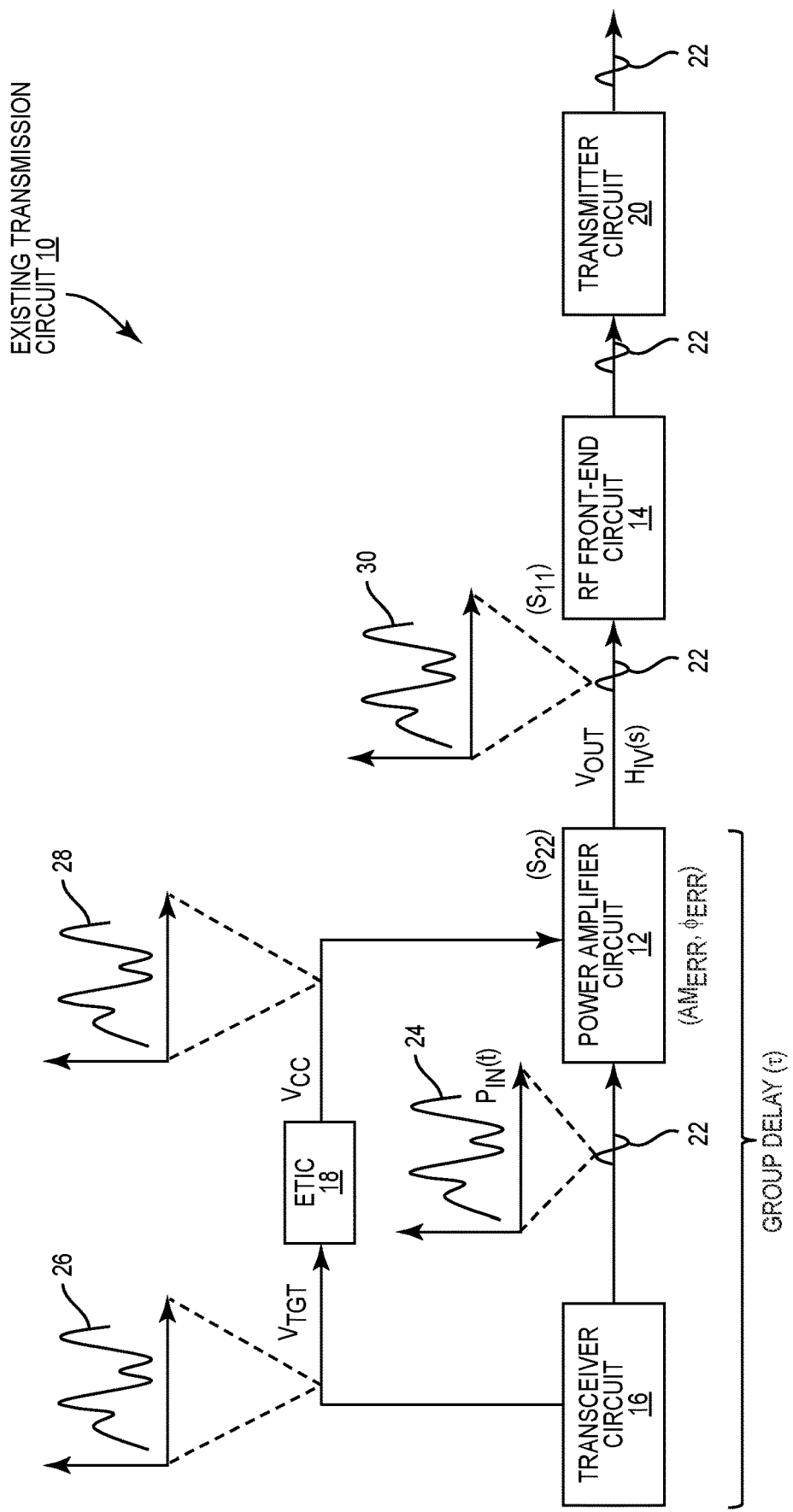
FIG. 1A is a schematic diagram of an exemplary existing transmission circuit, wherein unwanted amplitude-amplitude (AM-AM) and amplitude-phase (AM-PM) errors may be created when a power amplifier circuit is coupled to a radio frequency (RF) front-end circuit.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to phase and amplitude error correction in a transmission circuit. The transmission circuit includes a transceiver circuit, a power management integrated circuit (PMIC), and a power amplifier circuit(s). The transceiver circuit generates a radio frequency (RF) signal(s) from an input vector, the PMIC generates a modulated voltage, and the power amplifier circuit(s) amplifies the RF signal(s) based on the modulated voltage. When the power amplifier circuit(s) is coupled to an RF front-end circuit (e.g., filter/multiplexer), an output reflection coefficient (e.g., $S_{22}$) of the power amplifier circuit(s) can interact with an input reflection coefficient (e.g., $S_{11}$) of the RF front-end circuit to create a voltage distortion filter on an output stage of the power amplifier circuit(s), which can cause unwanted amplitude-amplitude (AM-AM) and amplitude-phase (AM-PM) errors across a modulation bandwidth of the transmission circuit. In this regard, in embodiments disclosed herein, the transceiver circuit is configured to equalize the input vector using multiple complex filters to thereby correct the AM-AM and AM-PM errors. As a result, it is possible to reduce undesired instantaneous excessive compression and/or spectrum regrowth to thereby improve efficiency and linearity of the power amplifier circuit(s) across the modulation bandwidth.

Figure 2:
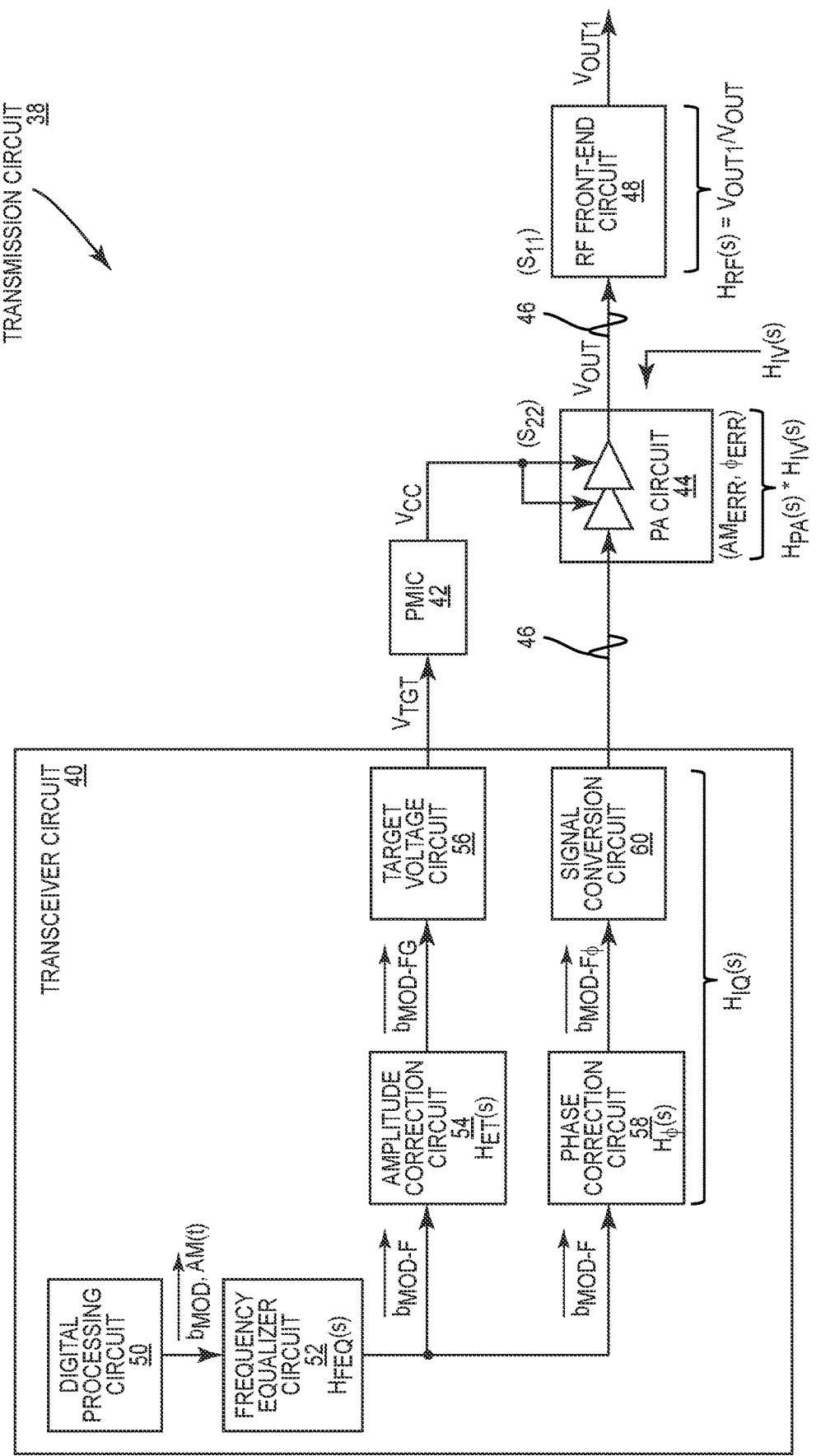
FIG. 2 is a schematic diagram of an exemplary transmission circuit wherein a transceiver circuit can be configured according to embodiments of the present disclosure to correct unwanted AM-AM and AM-PM errors described in FIGS. 1A-1E.

Before discussing the transmission circuit according to the present disclosure, starting at FIG. 2, a brief discussion of an existing transmission circuit is first provided to help understand how an unwanted voltage distortion filter may be created when a power amplifier circuit is coupled to an RF front-end circuit, such as a filter/multiplexer circuit.

FIG. 1A is a schematic diagram of an exemplary existing transmission circuit 10, wherein an unwanted voltage distortion filter $H_{IV}(s)$ may be created on a power amplifier circuit 12 when the power amplifier circuit 12 is coupled to an RF front-end circuit 14. Notably, in the unwanted voltage distortion filter $H_{IV}(s)$, "s" is a notation of Laplace transform. The existing transmission circuit 10 includes a transceiver circuit 16, an envelope tracking (ET) integrated circuit (ETIC) 18, and a transmitter circuit 20, which can include an antenna(s) (not shown) as an example.

The transceiver circuit 16 is configured to generate an RF signal 22 having a time-variant input power $P_{IN}(t)$ that corresponds to a time-variant voltage envelope 24 and provides the RF signal 22 to the power amplifier circuit 12. The transceiver circuit 16 is also configured to generate a time-variant target voltage $V_{TGT}$, which is associated with a time-variant target voltage 26 that tracks the time-variant voltage envelope 24 of the RF signal 22. The ETIC 18 is configured to generate a modulated voltage $V_{CC}$ having a time-variant modulated voltage 28 that tracks the time-variant target voltage 26 of the time-variant target voltage $V_{TGT}$ and provides the modulated voltage $V_{CC}$ to the power amplifier circuit 12. The power amplifier circuit 12 is configured to amplify the RF signal 22 based on the modulated voltage $V_{CC}$ to a time-variant output voltage $V_{OUT}$ associated with a time-variant output voltage envelope 30. The power amplifier circuit 12 then provides the amplified RF signal 22 to the RF front-end circuit 14. The RF front-end circuit 14 may be a filter circuit that performs further frequency filtering on the amplified RF signal 22 before providing the amplified RF signal 22 to the transmitter circuit 20 for transmission.

Figure 1B:
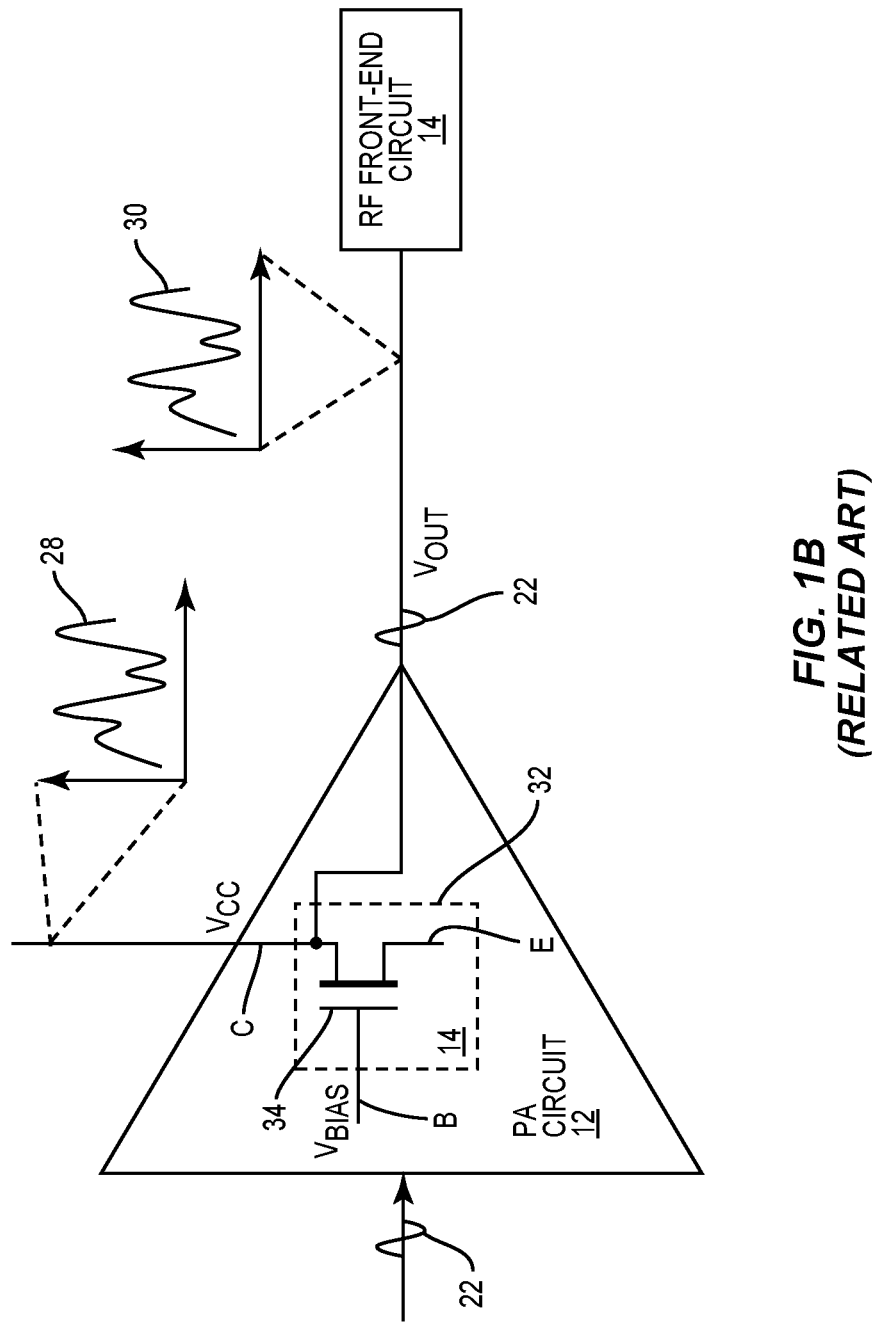
FIG. 1B is a schematic diagram providing an exemplary illustration of an output stage of the power amplifier circuit in FIG. 1A.

FIG. 1B is a schematic diagram providing an exemplary illustration of an output stage 32 of the power amplifier circuit 12 in FIG. 1A. Common elements between FIGS. 1A and 1B are shown therein with common element numbers and will not be re-described herein.

The output stage 32 can include at least one transistor 34, such as a bipolar junction transistor (BJT) or a complementary metal-oxide semiconductor (CMOS) transistor. Taking the BJT as an example, the transistor 34 can include a base electrode B, a collector electrode C, and an emitter electrode E. The base electrode B is configured to receive a bias voltage $V_{BIAS}$ and the collector electrode C is configured to receive the modulated voltage $V_{CC}$. The collector electrode C is also coupled to the RF front-end circuit 14 and configured to output the amplified RF signal 22 at the output voltage $V_{OUT}$. In this regard, the output voltage $V_{OUT}$ can be a function of the modulated voltage $V_{CC}$. Understandably, the power amplifier circuit 12 will operate with good efficiency and linearity when the time-variant modulated voltage 28 is aligned with the time-variant output voltage envelope 30.

Figure 1C:
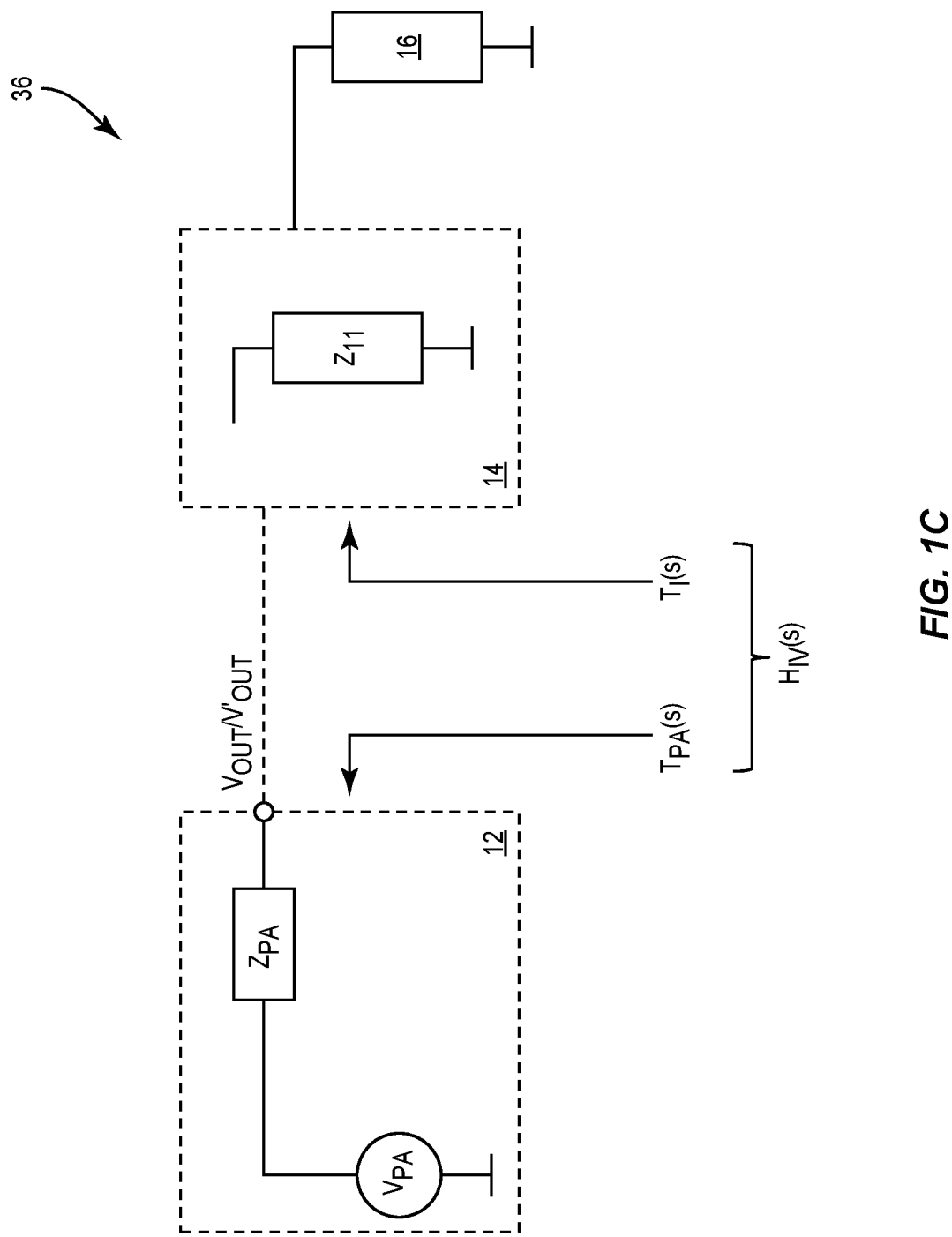
FIG. 1C is a schematic diagram of an exemplary equivalent model providing an exemplary illustration of the unwanted voltage distortion filter created by a coupling between the power amplifier circuit and the RF front-end circuit 14 in FIG. 1A.

FIG. 1C is a schematic diagram of an exemplary equivalent model 36 providing an exemplary illustration of the voltage distortion filter $H_{IV}(s)$ created by the coupling between the power amplifier circuit 12 and the RF front-end circuit 14 in the existing transmission circuit 10 of FIG. 1A. Common elements between FIGS. 1A-1C are shown therein with common element numbers and will not be re-described herein In the equivalent model 36, $V_{PA}$ and $Z_{PA}$ represent the output stage 32 of the power amplifier circuit 12 and an inherent impedance of the power amplifier circuit 12, respectively, and $Z_{11}$ represents an inherent impedance associated with an input port of the RF front-end circuit 14. Herein, $V_{OUT}$ represents an output voltage associated with the RF signal 22 before the power amplifier circuit 12 is coupled to the RF front-end circuit 14, and $V'_{OUT}$ represents an output voltage associated with the RF signal 22 after the power amplifier circuit 12 is coupled to the RF front-end circuit 14. Hereinafter, the output voltages $V_{OUT}$ and $V'_{OUT}$ are referred to as "non-coupled output voltage" and "coupled output voltage," respectively, for distinction.

A Laplace transform representative of the coupled output voltage $V'_{OUT}$ can be expressed in equation (Eq. 1) below.

$$V'_{OUT}(s) = \frac{V_{OUT}(s) * [1 - T_{PA}(s)] * [1 + T_I(s)]}{2 * [1 - T_{PA}(s) * T_I(s)]} = V_{OUT}(s) * H_{IV}(s) \qquad \text{(Eq. 1)}$$

$$H_{IV}(s) = \frac{[1 - T_{PA}(s)] * [1 + T_I(s)]}{2 * [1 - T_{PA}(s) * T_I(s)]}$$

In the equation (Eq. 1) above, $T_{PA}(s)$ represents a reflection coefficient looking back into the output stage 32 of the power amplifier circuit 12 and $T_I(s)$ represents a reflection coefficient looking into the RF front-end circuit 14. Notably, $T_{PA}(s)$ and $T_I(s)$ are complex filters containing amplitude and phase information. In this regard, the $T_{PA}(s)$, the $T_I(s)$, and, therefore, the voltage distortion filter $H_{IV}(s)$ are dependents of such factors as modulation bandwidth, RF frequency, and/or voltage standing wave ratio (VSWR).

The equation (Eq. 1) shows that the coupled output voltage $V'_{OUT}$ will be altered from the non-coupled output voltage $V_{OUT}$ by the voltage distortion filter $H_{IV}(s)$ when the power amplifier circuit 12 is coupled to the RF front-end circuit 14. Moreover, the variation of the non-coupled output voltage $V_{OUT}$ caused by the voltage distortion filter $H_{IV}(s)$ can happen across all frequencies in an entire modulation bandwidth of the RF signal 22. As a result, the coupled output voltage V'$_{OUT}$ may become misaligned from the modulated voltage V$_{CC}$ across the modulation bandwidth of the RF signal 22, thus causing frequency dependent AM-AM error AM$_{ERR}$ across frequencies in an entire modulation bandwidth of the RF signal 22. As such, it is necessary to correct the unwanted AM-AM error AM$_{ERR}$ to realign the coupled output voltage V'$_{OUT}$ with the modulated voltage V$_{CC}$ across the modulation bandwidth of the RF signal 22.

With reference back to FIG. 1A, when the power amplifier circuit 12 is coupled to the RF front-end circuit 14, an output reflection coefficient (e.g., $S_{22}$) of the power amplifier circuit 12 can interact with an input reflection coefficient (e.g., $S_{11}$) of the RF front-end circuit 14 to create a group delay $\tau$ in the RF signal 22. The group delay $\tau$, which can be expressed in equation (Eq. 2) below, can cause a phase error $\Delta\phi$ at the power amplifier circuit 12 to thereby create an AM-PM error $\phi$ERR in the RF signal 22.

$$\tau = -\Delta\phi/\Delta t \quad \text{(Eq. 2)}$$

Figure 1D:
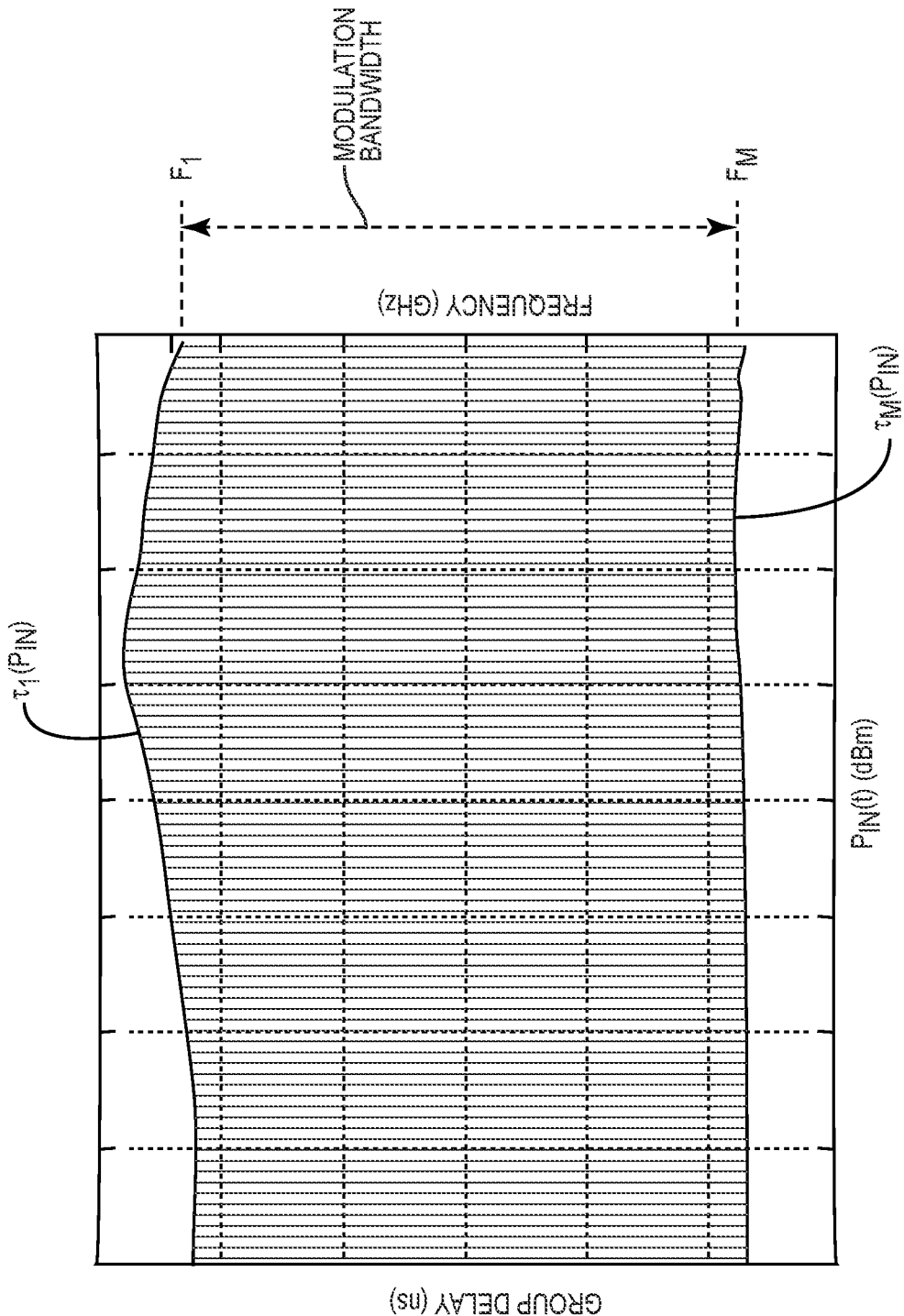
FIG. 1D is a graphic diagram illustrating a distribution of multiple group delays across multiple transmission frequencies.

Studies have shown that the group delay $\tau$ in each of the transmission frequencies varies in accordance with the time-variant input power P$_{IN}$(t), as illustrated in FIG. 1D. FIG. 1D is a graphic diagram illustrating a distribution of the group delay $\tau$ across multiple transmission frequencies $F_1$-$F_M$ within a modulation bandwidth of the RF signal 22 in FIG. 1A. As shown in FIG. 1D, each of the transmission frequencies $F_1$-$F_M$ is associated with a respective one of multiple variable group delays $\tau_1(P_{IN})$-$\tau_M(P_{IN})$, and each of the variable group delays $\tau_1(P_{IN})$-$\tau_M(P_{IN})$ varies independently in accordance with the time-variant input power P$_{IN}$(t).

Figure 1E:
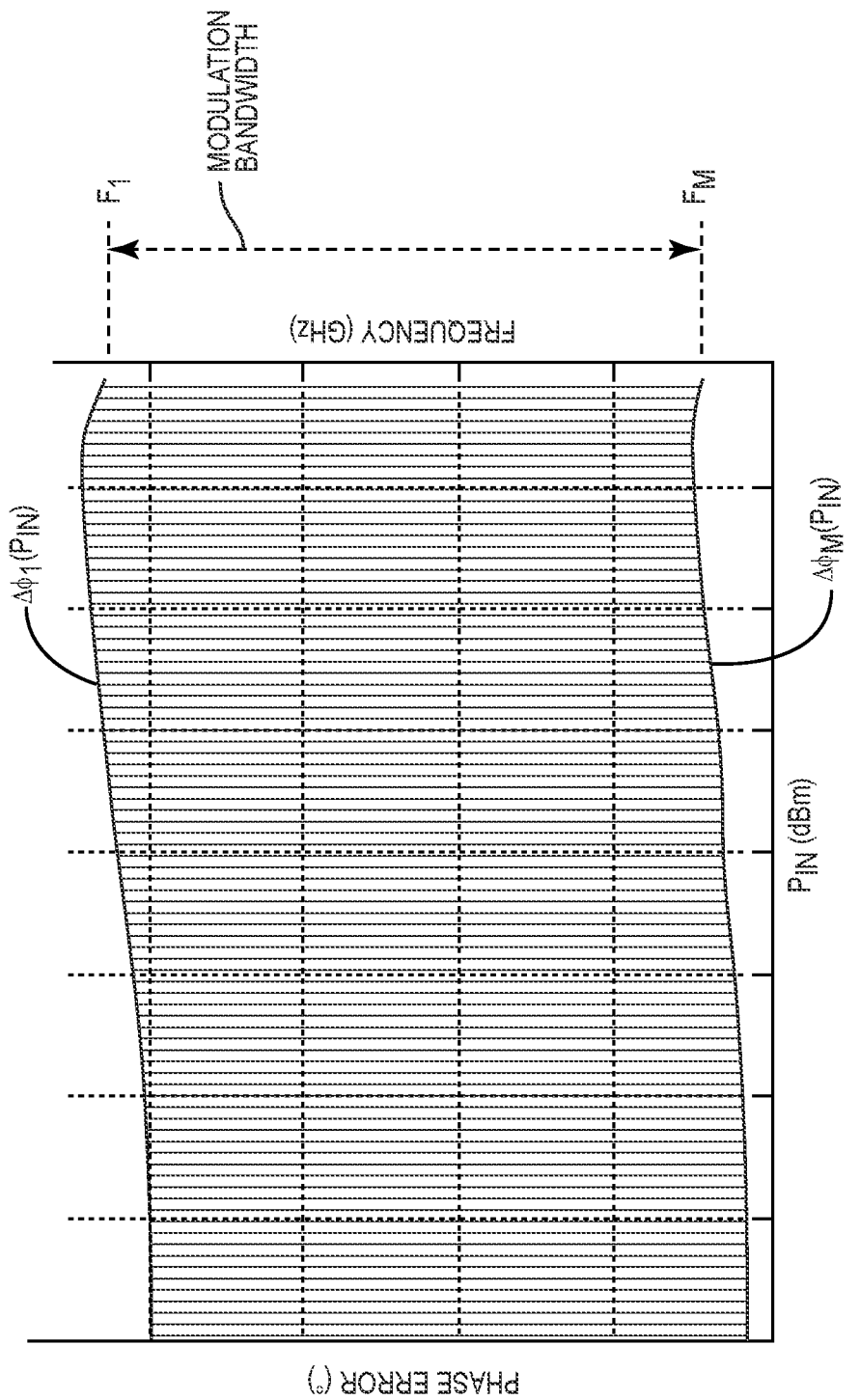
FIG. 1E is a graphic diagram illustrating a distribution of multiple variable phase errors across the multiple transmission frequencies in FIG. 1D.

Given the relationship between the group delay $\tau$ and the phase error $\Delta\phi$ in equation (Eq. 2), the phase error $\Delta\phi$ associated with each of the variable group delays $\tau_1(P_{IN})$-$\tau_M(P_{IN})$ will also vary according to the time-variant input power P$_{IN}$(t). FIG. 1E is a graphic diagram illustrating a distribution of the variable phase errors $\Delta\phi_1(P_{IN})$-$\Delta\phi_M(P_{IN})$ across the transmission frequencies $F_1$-$F_M$ of the RF signal 22 in FIG. 1A. As shown in FIG. 1E, each of the transmission frequencies $F_1$-$F_M$ is associated with a respective one of multiple variable phase errors $\Delta\phi_1(P_{IN})$-$\Delta\phi_M(P_{IN})$. Moreover, for any given level of the time-variant input power P$_{IN}$(t), each of the variable phase errors $\Delta\phi_1(P_{IN})$-$\Delta\phi_M(P_{IN})$ associated with a respective one of the transmission frequencies $F_1$-$F_M$ is nonlinear relative to any other variable phase errors $\Delta\phi_1(P_{IN})$-$\Delta\phi_M(P_{IN})$ associated with any other transmission frequencies $F_1$-$F_M$. For example, the variable phase errors $\Delta\phi_1(P_{IN})$ associated with the transmission frequency $F_1$ is nonlinearly related to the variable phase errors $\Delta\phi_M(P_{IN})$ associated with the transmission frequency $F_M$ for any given value of the time-variant input power P$_{IN}$(t).

The variable phase errors $\Delta\phi_1(P_{IN})$-$\Delta\phi_M(P_{IN})$ can cause the AM-PM error $\phi_{ERR}$ in the RF signal 22, which can lead to undesired amplitude distortion and/or spectrum regrowth within the modulation bandwidth of the RF signal 22. As such, it is also necessary to correct variable phase errors $\Delta\phi_1(P_{IN})$-$\Delta\phi_M(P_{IN})$ across the transmission frequencies $F_1$-$F_M$ to prevent undesired amplitude distortion and/or spectrum regrowth within the modulation bandwidth of the RF signal 22.

In this regard, FIG. 2 is a schematic diagram of an exemplary transmission circuit 38 wherein a transceiver circuit 40 can be configured according to embodiments of the present disclosure to correct the AM-AM AM$_{ERR}$ and AM-PM error $\phi_{ERR}$ described in FIGS. 1A-1E. In an embodiment, the transmission circuit 38 further includes a PMIC 42 and a power amplifier circuit 44. The transceiver circuit 40 is configured to generate an RF signal 46 and provides the RF signal 46 to the power amplifier circuit 44. The power amplifier circuit 44 is configured to amplify the RF signal 46 based on a modulated voltage V$_{CC}$, which can be an ET modulated voltage or an average power tracking (APT) modulated voltage. The PMIC 42 is configured to generate the modulated voltage V$_{CC}$ based on a modulated target voltage V$_{TGT}$, and the transceiver circuit 40 is configured to generate and provide the modulated target voltage V$_{TGT}$ to the PMIC 42.

Like the power amplifier circuit 12 in FIG. 1A, the power amplifier circuit 44 herein can also include the output stage 32 (as shown in FIG. 1B) and be coupled to an RF front-end circuit 48 (e.g., a filter, multiplexer, and/or switches). As such, the transmission circuit 38 may suffer the AM-AM error AM$_{ERR}$ and the AM-PM error $\phi_{ERR}$ that are similar to the AM-AM error AM$_{ERR}$ and AM-PM error $\phi_{ERR}$ in the existing transmission circuit 10 of FIG. 1A. In other words, in the transmission circuit 38, there may also exist the voltage distortion filter H$_{IV}$(s) that creates the AM-AM error AM$_{ERR}$ due to misalignment between the non-coupled output voltage and the coupled output voltage V'$_{OUT}$, as well as the AM-PM error $\phi_{ERR}$ due to the time-variant group delay $\tau$.

As described in detail below, the transmission circuit 38 can be configured according to various embodiments of the present disclosure to effectively correct the AM-AM error AM$_{ERR}$ and the AM-PM error $\phi_{ERR}$. More specifically, the transceiver circuit 40 can concurrently correct the AM-AM and AM-PM errors via multiple complex filters. As a result, the transmission circuit 38 can reduce undesired instantaneous excessive compression and/or spectrum regrowth to thereby improve efficiency and linearity of the power amplifier circuit 44 across an entire modulation bandwidth of the transmission circuit 38.

Herein, the transceiver circuit 40 includes a digital processing circuit 50, a frequency equalizer circuit 52, an amplitude correction circuit 54, a target voltage circuit 56, a phase correction circuit 58, and a signal conversion circuit 60. The digital processing circuit 50, which can be a digital baseband circuit as an example, is configured to generate an input vector $\overrightarrow{b_{MOD}}$. The input vector $\overrightarrow{b_{MOD}}$ is modulated across a modulation bandwidth (e.g., 200 MHz) that includes multiple modulation frequencies $F_1$-$F_M$.

Figure 3B:
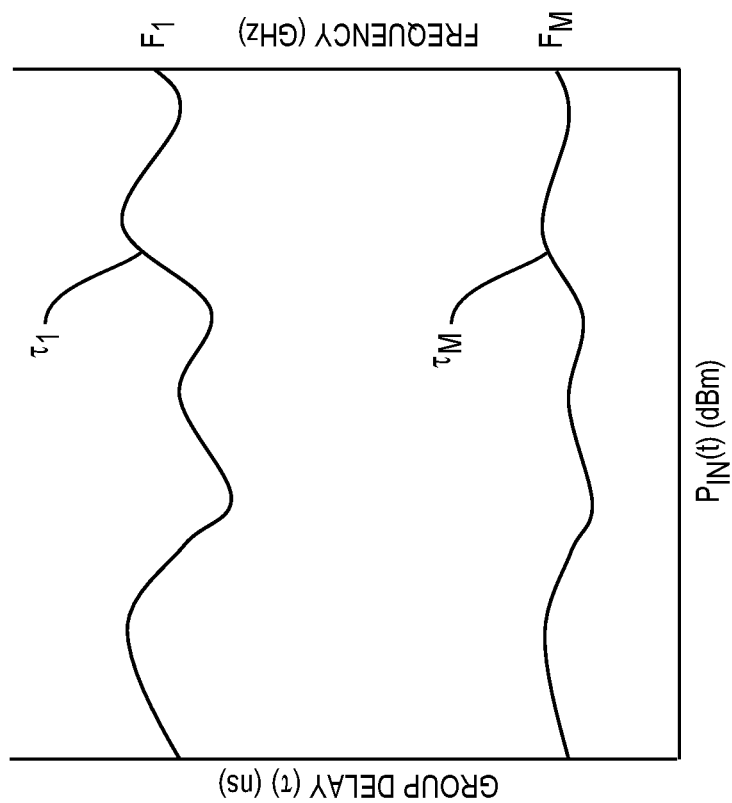
FIG. 3B is a graphic diagram providing an exemplary illustration of multiple time-variant group delay curves that are different across the modulation frequencies in FIG. 3A.
Figure 3A:
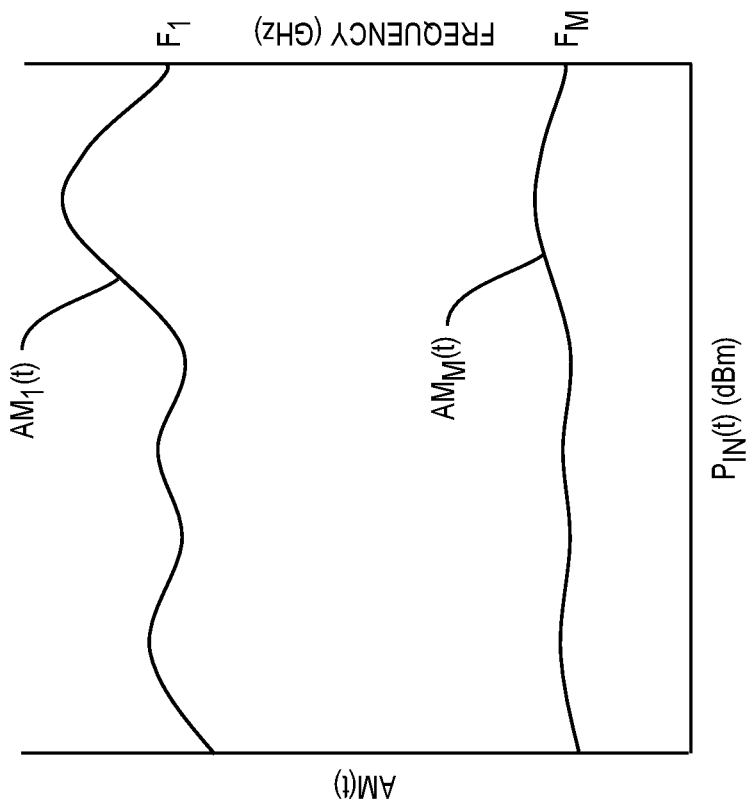
FIG. 3A is a graphic diagram providing an exemplary illustration of multiple time-variant amplitude curves that are different across multiple modulation frequencies.

As illustrated in FIG. 3A, the input vector $\overrightarrow{b_{MOD}}$ is associated with multiple time-variant amplitudes AM$_1$(t)-AM$_M$(t), and each of the time-variant amplitudes AM$_1$(t)-AM$_M$(t) is dependent on a respective one of the modulation frequencies $F_1$-$F_M$. In other words, the time-variant amplitudes AM$_1$(t)-AM$_M$(t) can be different from one another between the modulation frequencies $F_1$-$F_M$.

As illustrated in FIG. 3B, the input vector $\overrightarrow{b_{MOD}}$ is also associated with multiple time-variant group delays $\tau_1$-$\tau_M$, and each of the time-variant group delays $\tau_1$-$\tau_M$ is dependent on corresponding to a respective one of the modulation frequencies $F_1$-$F_M$. In other words, the time-variant group delays $\tau_1$-$\tau_M$ can be different from one another between the modulation frequencies $F_1$-$F_M$.

According to an embodiment of the present disclosure, a first step toward correcting the AM-AM error AM$_{ERR}$ and the AM-PM error $\phi_{ERR}$ in the transmission circuit 38 is to remove frequency dependency of the time-variant amplitudes AM$_1$(t)-AM$_M$(t) and the time-variant group delays $\tau_1$-$\tau_M$. In this regard, the frequency equalizer circuit 52 is configured to apply a frequency equalization filter $H_{FEQ}(s)$ to the input vector $\vec{b}_{MOD}$ to thereby generate a frequency-equalized input vector $\vec{b}_{MOD-F}$. The frequency equalization filter $H_{FEQ}(s)$ can be a complex filter as expressed in equation (Eq. 3) below.

$$H_{FEQ}(s)=[1/H_{ET}(s)]*[1/H_{RF}(s)] \quad (Eq.\ 3)$$

In the equation (Eq. 3), $H_{RF}(s)$ represents a transfer function of the RF front-end circuit 48, which can be expressed as a ratio between $V_{OUT1}$ and $V_{OUT}$. $H_{ET}(s)$ is a combined complex filter, as expressed in equation (Eq. 4), configured to match a combined signal path filter that includes a transfer function $H_{IQ}(s)$ of the phase correction circuit 58 and the signal conversion circuit 60, a voltage gain transfer function $H_{PA}(s)$ of the power amplifier circuit 44, and the voltage distortion filter $H_{IV}(s)$.

$$H_{ET}(s)=H_{IQ}(s)*H_{PA}(s)*H_{IV}(s) \quad (Eq.\ 4)$$

Figure 4B:
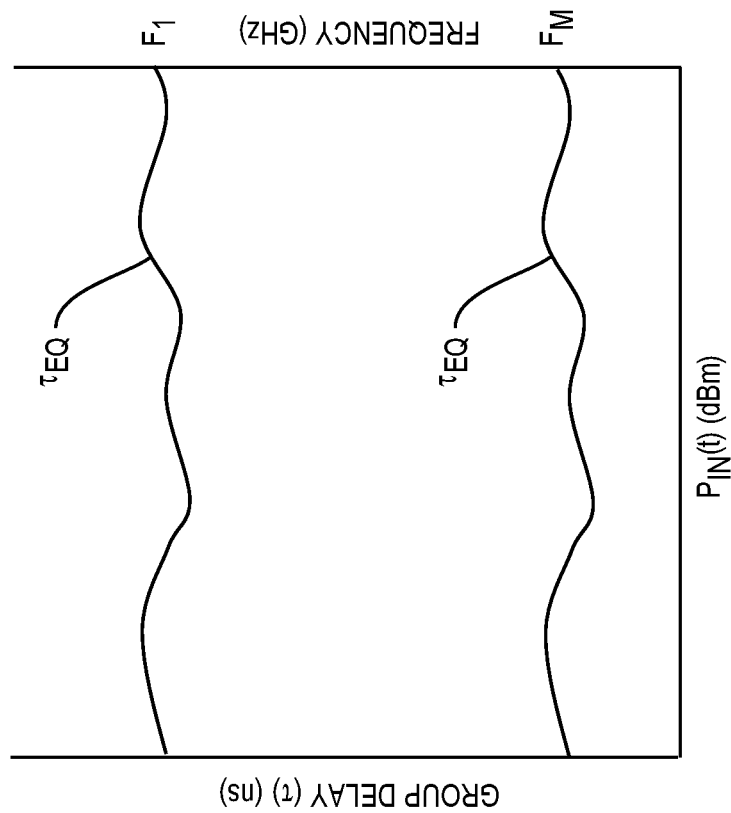
FIG. 4B is a graphic diagram providing an exemplary illustration of multiple equalized time-variant group delay curves that become identical across the modulation frequencies in FIG. 3A as a result of the frequency equalization performed in the transceiver circuit in FIG. 2.
Figure 4A:
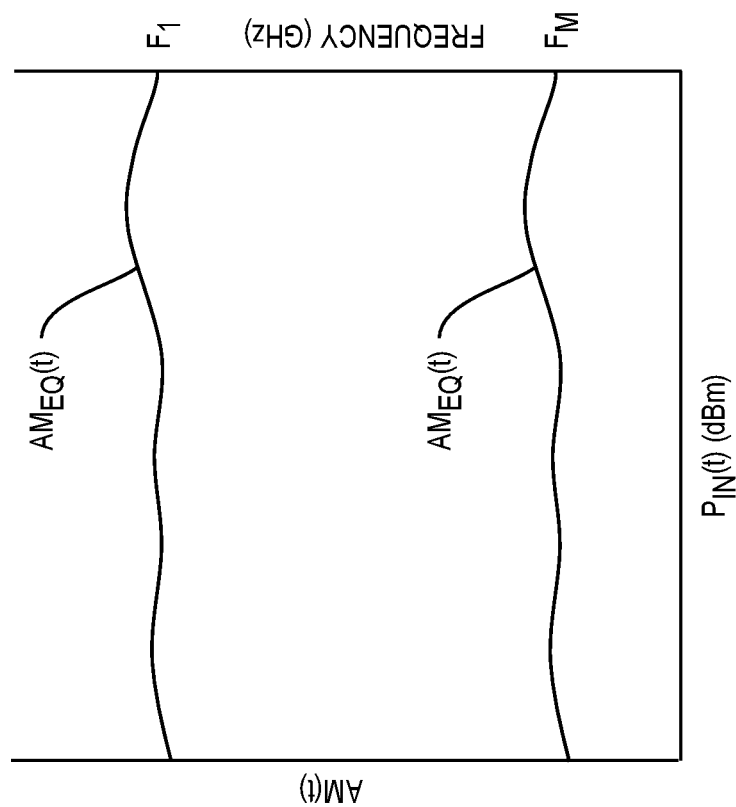
FIG. 4A is a graphic diagram providing an exemplary illustration of multiple equalized time-variant amplitude curves that become identical across the modulation frequencies in FIG. 3A as a result of a frequency equalization performed in the transceiver circuit in FIG. 2.

As illustrated in FIGS. 4A and 4B, by applying the frequency equalization filter $H_{FEQ}(s)$ to the input vector $\vec{b}_{MOD}$, the frequency-equalized input vector $\vec{b}_{MOD-F}$ can instead be associated with an equalized time-variant amplitude $AM_{EQ}(t)$ that is identical in each of the plurality of modulation frequencies $F_1$-$F_M$ and an equalized time-variant group delay $\tau_{EQ}$ that is also identical in each of the modulation frequencies $F_1$-$F_M$. In other words, the equalized time-variant amplitude $AM_{EQ}(t)$ and the equalized time-variant group delay $\tau_{EQ}$ are no longer depending on the modulation frequencies $F_1$-$F_M$.

To correct the AM-PM error $\phi_{ERR}$, the phase correction circuit 58 is configured to determine, based on the frequency-equalized vector $\vec{b}_{MOD-F}$, a phase correction term $\Delta\phi_{CORR}$ to correct the AM-PM error $\phi_{ERR}$ in the RF signal 46. Accordingly, the phase correction circuit 58 applies the determined phase correction term $\Delta\phi_{CORR}$ to the frequency-equalized vector $\vec{b}_{MOD-F}$ to generate a frequency-phase-equalized signal $\vec{b}_{MOD-F\phi}$. The signal conversion circuit 60 will generate the RF signal 46 based on the frequency-phase-equalized signal $\vec{b}_{MOD-F\phi}$ to thereby correct the AM-PM error $\phi_{ERR}$ in the RF signal 46.

Figure 5:
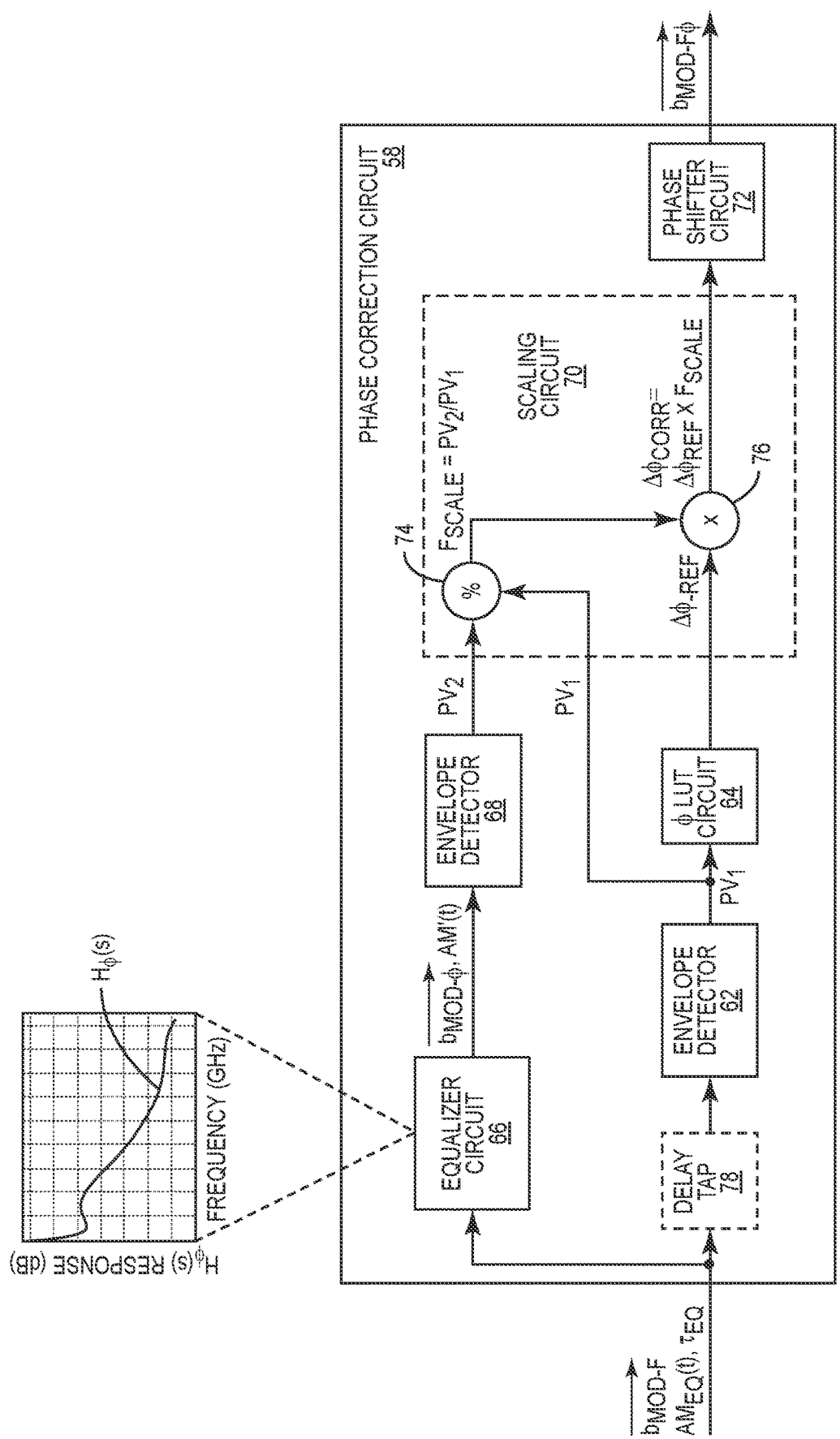
FIG. 5 is a schematic diagram of an exemplary phase correction circuit provided in the transceiver circuit in FIG. 2.

FIG. 5 is a schematic diagram providing an exemplary illustration of the phase correction circuit 58 in the transceiver circuit 40 in FIG. 2 according to one embodiment of the present disclosure. Common elements between FIGS. 2 and 5 are shown therein with common element numbers and will not be re-described herein.

Herein, the phase correction circuit 58 includes a first envelope detector 62, a phase correction lookup table (LUT) circuit 64, a phase equalizer circuit 66, a second envelope detector 68, a scaling circuit 70, and a phase shifter circuit 72. The first envelope detector 62 is configured to detect a first power envelope $PV_1$ associated with the equalized time-variant amplitude $AM_{EQ}(t)$ of the frequency-equalized vector $\vec{b}_{MOD-F}$. The phase correction LUT circuit 64 is configured to determine a reference phase offset $\Delta\phi_{REF}$ corresponding to a reference frequency $F_{REF}$ based on the detected first power envelope $PV_1$. In a non-limiting example, the reference frequency $F_{REF}$ may be any one of the modulation frequencies $F_1$-$F_M$, a center frequency of the modulation bandwidth of the RF signal 46, or even an arbitrary frequency.

The phase equalizer circuit 66, which can be a finite impulse response (FIR) filter, is configured to apply a second complex filter $H_\phi(s)$ to the frequency-equalized vector $\vec{b}_{MOD-F}$ for a selected one of the transmission frequencies $F_1$-$F_M$. Accordingly, the phase equalizer circuit 66 can generate a phase-equalized vector $\vec{b}_{MOD-\phi}$ having a second time-variant amplitude $AM'(t)$. The second envelope detector 68 is configured to determine a second power envelope $PV_2$ associated with the second time-variant amplitude $AM'(t)$.

In an embodiment, the scaling circuit 70 includes a divider 74 and a multiplier 76. The divider 74 is configured to divide the second power envelope $PV_2$ by the first power envelope $PV_1$ to thereby determine a scaling factor $F_{SCALE}$. In this regard, the scaling factor $F_{SCALE}$ can be said to be a function of the first power envelope $PV_1$ and the second power envelope $PV_2$. The multiplier 76 is configured to multiply the reference phase offset $\Delta\phi_{REF}$ by the scaling factor $F_{SCALE}$ to thereby generate the phase correction term $\Delta\phi_{CORR}$.

The phase shifter circuit 72 is configured to apply the phase correction term $\Delta\phi_{CORR}$ to the frequency-equalized vector $\vec{b}_{MOD-F}$ to generate the frequency-phase-equalized signal $\vec{b}_{MOD-F\phi}$. The phase correction circuit 58 may further include a delay tap 78. In an embodiment, the delay tap 78 is configured to delay the frequency-equalized vector $\vec{b}_{MOD-F}$ to thereby align the first power envelope $PV_1$ with the second power envelope $PV_2$ at the divider 74.

With reference back to FIG. 2, to correct the AM-AM error $AM_{ERR}$, the amplitude correction circuit 54 is configured to equalize the frequency-equalized input vector $\vec{b}_{MOD-F}$ to thereby generate a frequency-gain-equalized signal $\vec{b}_{MOD-FG}$ having a constant gain across the equalized time-variant amplitude $AM_{EQ}(t)$. The target voltage circuit 56, in turn, generates the modulated target voltage $V_{TGT}$ from the frequency-gain-equalized signal $\vec{b}_{MOD-FG}$ and provides the modulated target voltage $V_{TGT}$ to the PMIC 42.

Figure 6:
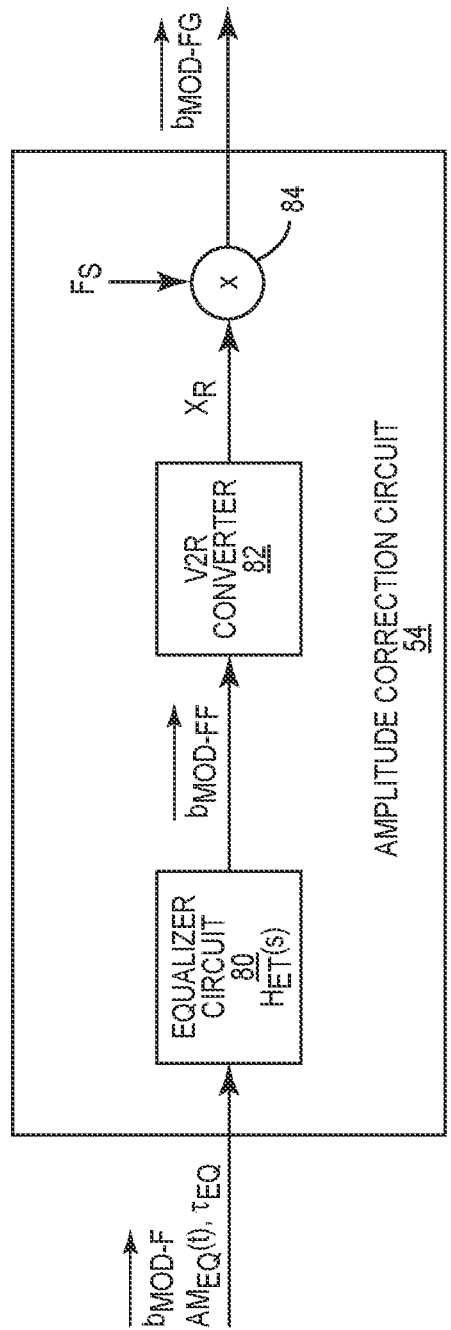
FIG. 6 is a schematic diagram of an exemplary amplitude correction circuit provided in the transceiver circuit in FIG. 2.

FIG. 6 is a schematic diagram providing an exemplary illustration of the amplitude correction circuit 54 in the transceiver circuit 40 in FIG. 2 according to one embodiment of the present disclosure. Common elements between FIGS. 2 and 6 are shown therein with common element numbers and will not be re-described herein.

Herein, the amplitude correction circuit 54 includes an equalizer circuit 80, a vector-to-real (V2R) converter 82, and a scaler 84. The equalizer circuit 80 is configured to apply the gain equalization filter $H_{ET}(s)$ to the frequency-equalized input vector $\vec{b}_{MOD-F}$ to generate a filtered input vector $\vec{b}_{MOD-FF}$. The V2R converter 82 is coupled to the equalizer circuit 80 and configured to extract a selected real parameter $X_R$ from the filtered input vector $\vec{b}_{MOD-FF}$. The scaler 84 is coupled to the V2R converter 82 and configured to scale the selected real parameter $X_R$ based on a scaling factor $F_S$ to thereby generate the frequency-gain-equalized signal $\vec{b}_{MOD-FG}$. For an in-depth description of the amplitude correction circuit 54, please refer to U.S. Pat. No. 12,199,577, entitled "ENVELOPE TRACKING VOLTAGE CORRECTION IN A TRANSMISSION CIRCUIT."

The transceiver circuit 40 may be configured to correct phase and amplitude errors according to a process. In this regard, FIG. 7 is a flowchart of an exemplary process 200 that can be employed by the transceiver circuit 40 in FIG. 2 to correct the AM-AM $AM_{ERR}$ and AM-PM error $\phi_{ERR}$.

Herein, the transceiver circuit 40 generates the input vector $\vec{b}_{MOD}$, which is modulated across the modulation bandwidth including the modulation frequencies $F_1$-$F_M$ (step 202). As previously described, the input vector $\vec{b}_{MOD}$ is associated with the time-variant amplitudes $AM_1(t)$-$AM_M(t)$ and the time-variant group delays $\tau_1$-$\tau_M$, each corresponding to a respective one of the modulation frequencies $F_1$-$F_M$. The transceiver circuit 40 also applies the frequency equalization filter $H_{FEQ}(s)$ to the input vector $\vec{b}_{MOD}$ to thereby generate the frequency-equalized input vector $\vec{b}_{MOD-F}$ (step 202). Notably, the frequency-equalized input vector $\vec{b}_{MOD-F}$ is associated with the equalized time-variant amplitude $AM_{EQ}(t)$ that is identical in each of the modulation frequencies $F_1$-$F_M$ and the equalized time-variant group delay $\tau_{EQ}$ that is also identical in each of the plurality of modulation frequencies.

Those skilled in the art will recognize improvements and modifications to the preferred embodiments of the present disclosure. All such improvements and modifications are considered within the scope of the concepts disclosed herein and the claims that follow.

What is claimed is:

1. A transceiver circuit comprising:
   a digital processing circuit configured to generate an input vector modulated across a modulation bandwidth comprising a plurality of modulation frequencies, the input vector is associated with a plurality of time-variant amplitudes and a plurality of time-variant group delays each corresponding to a respective one of the plurality of modulation frequencies;
   a frequency equalizer circuit configured to apply a frequency equalization filter to the input vector to thereby modify the plurality of time-variant amplitudes and the plurality of time-variant group delays and generate a frequency-equalized input vector associated with:
      an equalized time-variant amplitude that is identical in each of the plurality of modulation frequencies; and
      an equalized time-variant group delay that is identical in each of the plurality of modulation frequencies and
   a phase correction circuit configured to:
      determine, based on the frequency-equalized input vector, a phase correction term configured to correct a phase error caused by the equalized time-variant group delay in a selected one of the plurality of modulation frequencies; and
      apply the determined phase correction term to the frequency-equalized input vector to generate a frequency-phase-equalized signal corresponding to the selected one of the plurality of modulation frequencies.

2. The transceiver circuit of claim 1, wherein the phase correction circuit comprises:
   a first envelope detector configured to detect a first power envelope of the equalized time-variant amplitude of the frequency-equalized input vector;
   a phase correction lookup table (LUT) circuit configured to determine a reference phase offset corresponding to a reference frequency based on the detected first power envelope;
   a phase equalizer circuit configured to equalize the frequency-equalized input vector based on a second complex filter defined for the selected one of the plurality of modulation frequencies to generate a phase-equalized vector having a second time-variant amplitude;
   a second envelope detector configured to determine a second power envelope associated with the second time-variant amplitude;
   a scaling circuit configured to:
      determine a scaling factor as a function of the first power envelope and the second power envelope; and
      scale the reference phase offset based on the determined scaling factor to thereby generate the determined phase correction term; and
   a phase shifter circuit configured to apply the determined phase correction term to the frequency-equalized input vector to generate the frequency-phase-equalized signal.

3. The transceiver circuit of claim 2, wherein the scaling circuit comprises:
   a divider configured to divide the second power envelope by the first power envelope to thereby determine the scaling factor; and
   a multiplier configured to multiply the reference phase offset by the scaling factor to thereby generate the determined phase correction term.

4. The transceiver circuit of claim 2, wherein the reference frequency is any one of the plurality of modulation frequencies.

5. The transceiver circuit of claim 2, wherein the second complex filter is a finite impulse response (FIR) filter.

6. The transceiver circuit of claim 2, wherein the phase correction circuit further comprises a delay tap configured to delay the frequency-equalized input vector to thereby align the first power envelope with the second power envelope at the scaling circuit.

7. The transceiver circuit of claim 1, further comprising an amplitude correction circuit configured to equalize the frequency-equalized input vector to thereby generate a frequency-gain-equalized signal having a constant gain across the equalized time-variant amplitude.

8. The transceiver circuit of claim 7, wherein the amplitude correction circuit comprises:
   an equalizer circuit configured to apply a gain equalization filter to the frequency-equalized input vector to generate a filtered input vector;
   a vector-to-real (V2R) converter coupled to the equalizer circuit and configured to extract a selected real parameter from the filtered input vector; and
   a scaler coupled to the V2R converter and configured to scale the selected real parameter based on a scaling factor to thereby generate the frequency-gain-equalized signal.

9. The transceiver circuit of claim 1, further comprising:
   an amplitude correction circuit configured to equalize the frequency-equalized input vector to thereby generate a frequency-gain-equalized signal having a constant gain across the equalized time-variant amplitude;
   a target voltage circuit configured to generate a modulated target voltage based on the frequency-gain-equalized signal; and
   a signal conversion circuit configured to convert the frequency-phase-equalized signal into a radio frequency (RF) signal.

10. A method for correcting phase and amplitude errors in a transmission circuit comprising:
    generating an input vector modulated across a modulation bandwidth comprising a plurality of modulation frequencies, the input vector is associated with a plurality of time-variant amplitudes and a plurality of time-variant group delays each corresponding to a respective one of the plurality of modulation frequencies; and applying a frequency equalization filter to the input vector to thereby modify the plurality of time-variant amplitudes and the plurality of time-variant group delays and generate a frequency-equalized input vector associated with:

an equalized time-variant amplitude that is identical in each of the plurality of modulation frequencies;

an equalized time-variant group delay that is identical in each of the plurality of modulation frequencies and determining, based on the frequency-equalized input vector, a phase correction term configured to correct a phase error caused by the equalized time-variant group delay in a selected one of the plurality of modulation frequencies; and applying the determined phase correction term to the frequency-equalized input vector to generate a frequency-phase-equalized signal corresponding to the selected one of the plurality of modulation frequencies.

11. The method of claim 10, further comprising:
detecting a first power envelope of the equalized time-variant amplitude of the frequency-equalized input vector;
determining a reference phase offset corresponding to a reference frequency based on the detected first power envelope;
equalizing the frequency-equalized input vector based on a second complex filter defined for the selected one of the plurality of modulation frequencies to generate a phase-equalized vector having a second time-variant amplitude;
determining a second power envelope associated with the second time-variant amplitude;
determining a scaling factor as a function of the first power envelope and the second power envelope;
scaling the reference phase offset based on the determined scaling factor to thereby generate the determined phase correction term; and
applying the determined phase correction term to the frequency-equalized input vector to generate the frequency-phase-equalized signal.

12. The method of claim 11, further comprising delaying the frequency-equalized input vector to thereby align the first power envelope with the second power envelope.

13. The method of claim 10, further comprising equalizing the frequency-equalized input vector to thereby generate a frequency-gain-equalized signal having a constant gain across the equalized time-variant amplitude.

14. The method of claim 13, further comprising:
applying a gain equalization filter to the frequency-equalized input vector to generate a filtered input vector;
extracting a selected real parameter from the filtered input vector; and
scaling the selected real parameter based on a scaling factor to thereby generate the frequency-gain-equalized signal.

15. A transmission circuit comprising a transceiver circuit, the transceiver circuit comprising:
a digital processing circuit configured to generate an input vector modulated across a modulation bandwidth comprising a plurality of modulation frequencies, the input vector is associated with a plurality of time-variant amplitudes and a plurality of time-variant group delays each corresponding to a respective one of the plurality of modulation frequencies;
a frequency equalizer circuit configured to apply a frequency equalization filter to the input vector to thereby modify the plurality of time-variant amplitudes and the plurality of time-variant group delays and generate a frequency-equalized input vector associated with:
an equalized time-variant amplitude that is identical in each of the plurality of modulation frequencies; and
an equalized time-variant group delay that is identical in each of the plurality of modulation frequencies and
a phase correction circuit configured to:
determine, based on the frequency-equalized input vector, a phase correction term configured to correct a phase error caused by the equalized time-variant group delay in a selected one of the plurality of modulation frequencies; and
apply the determined phase correction term to the frequency-equalized input vector to generate a frequency-phase-equalized signal corresponding to the selected one of the plurality of modulation frequencies.

16. The transmission circuit of claim 15, wherein the transceiver circuit further comprises:
an amplitude correction circuit configured to equalize the frequency-equalized input vector to thereby generate a frequency-gain-equalized signal having a constant gain across the equalized time-variant amplitude;
a target voltage circuit configured to generate a modulated target voltage based on the frequency-gain-equalized signal; and
a signal conversion circuit configured to convert the frequency-phase-equalized signal into a radio frequency (RF) signal.

17. The transmission circuit of claim 16, further comprising:
a power management integrated circuit (PMIC) configured to generate a modulated voltage based on the modulated target voltage; and
a power amplifier circuit configured to amplify the RF signal based on the modulated voltage.

18. The transmission circuit of claim 16, wherein the phase correction circuit comprises:
a first envelope detector configured to detect a first power envelope of the equalized time-variant amplitude of the frequency-equalized input vector;
a phase correction lookup table (LUT) circuit configured to determine a reference phase offset corresponding to a reference frequency based on the detected first power envelope;
a phase equalizer circuit configured to equalize the frequency-equalized input vector based on a second complex filter defined for the selected one of the plurality of modulation frequencies to generate a phase-equalized vector having a second time-variant amplitude;
a second envelope detector configured to determine a second power envelope associated with the second time-variant amplitude;
a scaling circuit configured to:
determine a scaling factor as a function of the first power envelope and the second power envelope; and
scale the reference phase offset based on the determined scaling factor to thereby generate the determined phase correction term; and a phase shifter circuit configured to apply the determined phase correction term to the frequency-equalized input vector to generate the frequency-phase-equalized signal.

* * * * *

UNITED STATES PATENT AND TRADEMARK OFFICE
CERTIFICATE OF CORRECTION

PATENT NO. : 12,284,003 B2
APPLICATION NO. : 17/939350
DATED : April 22, 2025
INVENTOR(S) : Nadim Khlat Page 1 of 1

It is certified that error appears in the above-identified patent and that said Letters Patent is hereby corrected as shown below:

In the Specification

In Column 7, at Line 20, please modify Eq. 2 to read:
$\tau = -\Delta\phi/\Delta t$ Signed and Sealed this
Tenth Day of June, 2025

Coke Morgan Stewart
*Acting Director of the United States Patent and Trademark Office*